(12) United States Patent
Li et al.

(10) Patent No.: US 10,971,577 B2
(45) Date of Patent: Apr. 6, 2021

(54) ADJUSTABLE MULTI-TURN MAGNETIC COUPLING DEVICE

(71) Applicant: Taiwan Semiconductor Manufacturing Co., Ltd., Hsin-Chu (TW)

(72) Inventors: Chao Chieh Li, Hsinchu (TW); Hao-chieh Chan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/438,266

(22) Filed: Jun. 11, 2019

(65) Prior Publication Data

US 2019/0296101 A1 Sep. 26, 2019

Related U.S. Application Data

(63) Continuation of application No. 15/151,098, filed on May 10, 2016, now Pat. No. 10,439,018.

(60) Provisional application No. 62/269,699, filed on Dec. 18, 2015.

(51) Int. Cl.
| | |
|---|---|
| *H01L 49/02* | (2006.01) |
| *H03B 5/12* | (2006.01) |
| *H01L 27/06* | (2006.01) |
| *H01L 27/092* | (2006.01) |

(52) U.S. Cl.
CPC .......... *H01L 28/10* (2013.01); *H01L 27/0617* (2013.01); *H01L 27/0623* (2013.01); *H01L 27/0641* (2013.01); *H01L 27/092* (2013.01); *H01L 28/40* (2013.01); *H03B 5/124* (2013.01); *H03B 5/1212* (2013.01); *H03B 5/1228* (2013.01); *H03B 5/1296* (2013.01)

(58) Field of Classification Search
None
See application file for complete search history.

(56) References Cited

U.S. PATENT DOCUMENTS

| | | |
|---|---|---|
| 8,279,008 B2 | 10/2012 | Hsieh et al. |
| 8,427,240 B2 | 4/2013 | Hsieh et al. |
| 8,593,206 B2 | 11/2013 | Chen et al. |
| 8,610,494 B1 | 12/2013 | Jin et al. |
| 8,618,631 B2 | 12/2013 | Jin et al. |
| 8,912,581 B2 | 12/2014 | Lin et al. |
| 8,941,212 B2 | 1/2015 | Yen et al. |
| 9,184,256 B2 | 11/2015 | Huang et al. |

(Continued)

*Primary Examiner* — Moazzam Hossain
*Assistant Examiner* — Stanetta D Isaac
(74) *Attorney, Agent, or Firm* — Duane Morris LLP

(57) ABSTRACT

According to some embodiments, an integrated circuit device is disclosed. The integrated circuit device include at least one inductor having at least one turn, a magnetic coupling ring positioned adjacent to the at least one inductor, the magnetic coupling ring comprising at least two magnetic coupling turns, the at least two magnetic coupling turns are disposed adjacent to the at least one turn to enable magnetic coupling between the at least two magnetic coupling turns and the at least one turn. The integrated circuit device also includes a power electrode and a ground electrode, wherein the power electrode and the ground electrode are coupled to the at least one inductor and the magnetic coupling ring to provide a first current in the at least one inductor having a direction opposite to a second current in the magnetic coupling ring to cancel at least a portion of a magnetic field generated by the at least one inductor.

20 Claims, 15 Drawing Sheets

(56) References Cited

U.S. PATENT DOCUMENTS

| | | |
|---|---|---|
| 9,209,521 B2 | 12/2015 | Hung et al. |
| 2009/0152674 A1 | 6/2009 | Uchida |
| 2010/0181638 A1 | 7/2010 | Wang |
| 2013/0168809 A1 | 7/2013 | Yen |
| 2013/0207230 A1 | 8/2013 | Jin |
| 2014/0132333 A1 | 5/2014 | Jin et al. |
| 2014/0217546 A1 | 8/2014 | Yen |
| 2014/0253262 A1 | 9/2014 | Hsieh et al. |
| 2014/0253391 A1 | 9/2014 | Yen |
| 2015/0364242 A1 | 12/2015 | Aboush |
| 2015/0364417 A1 | 12/2015 | Lee |

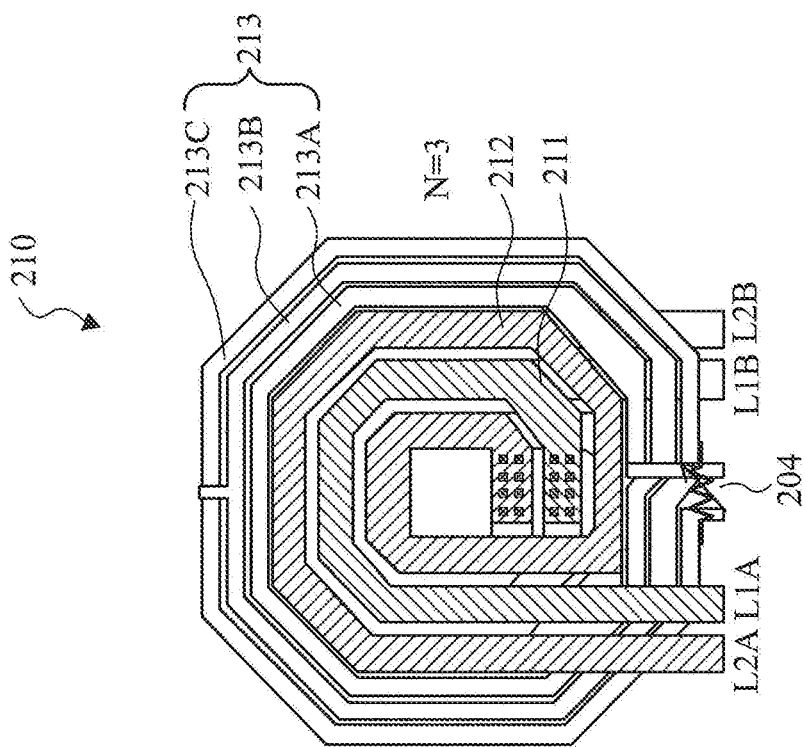
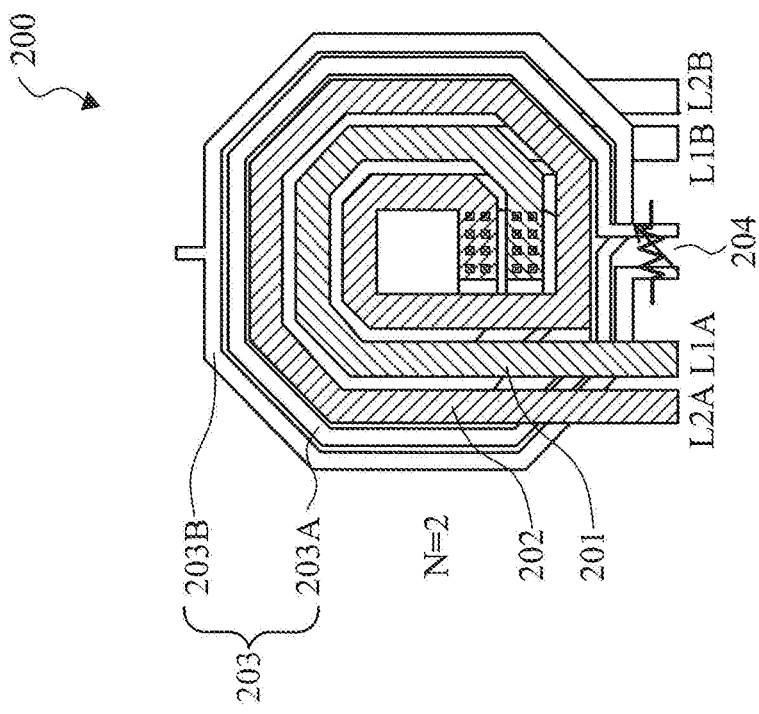
Fig. 2B
Fig. 2A $B_{MC} \propto N$

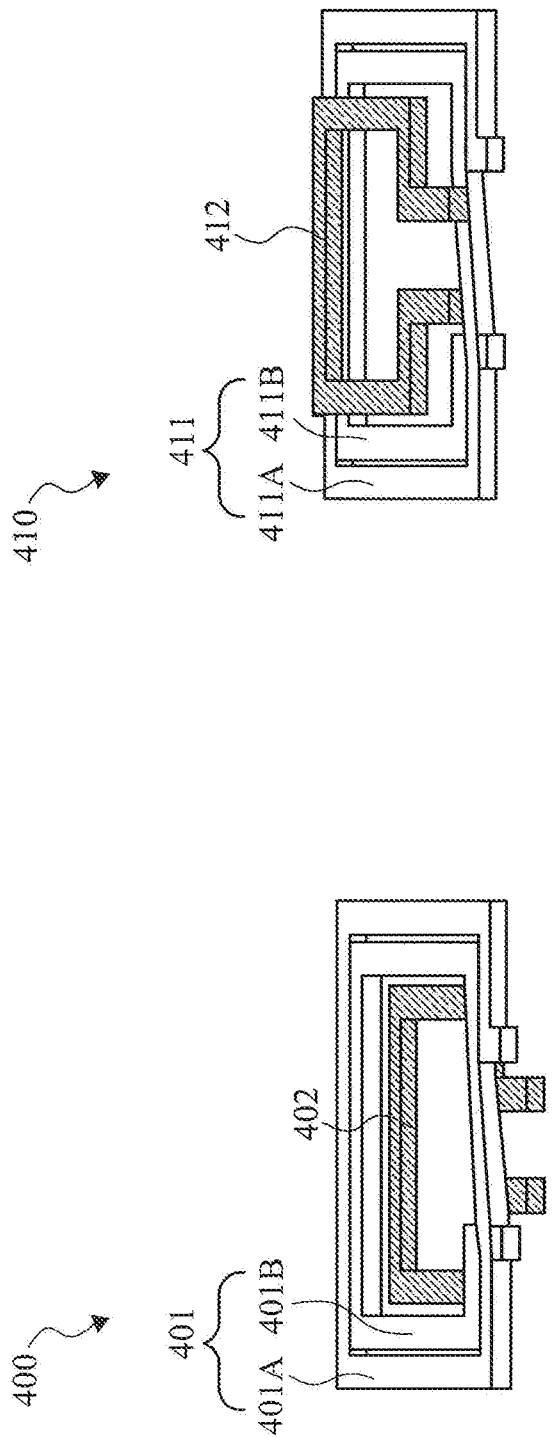

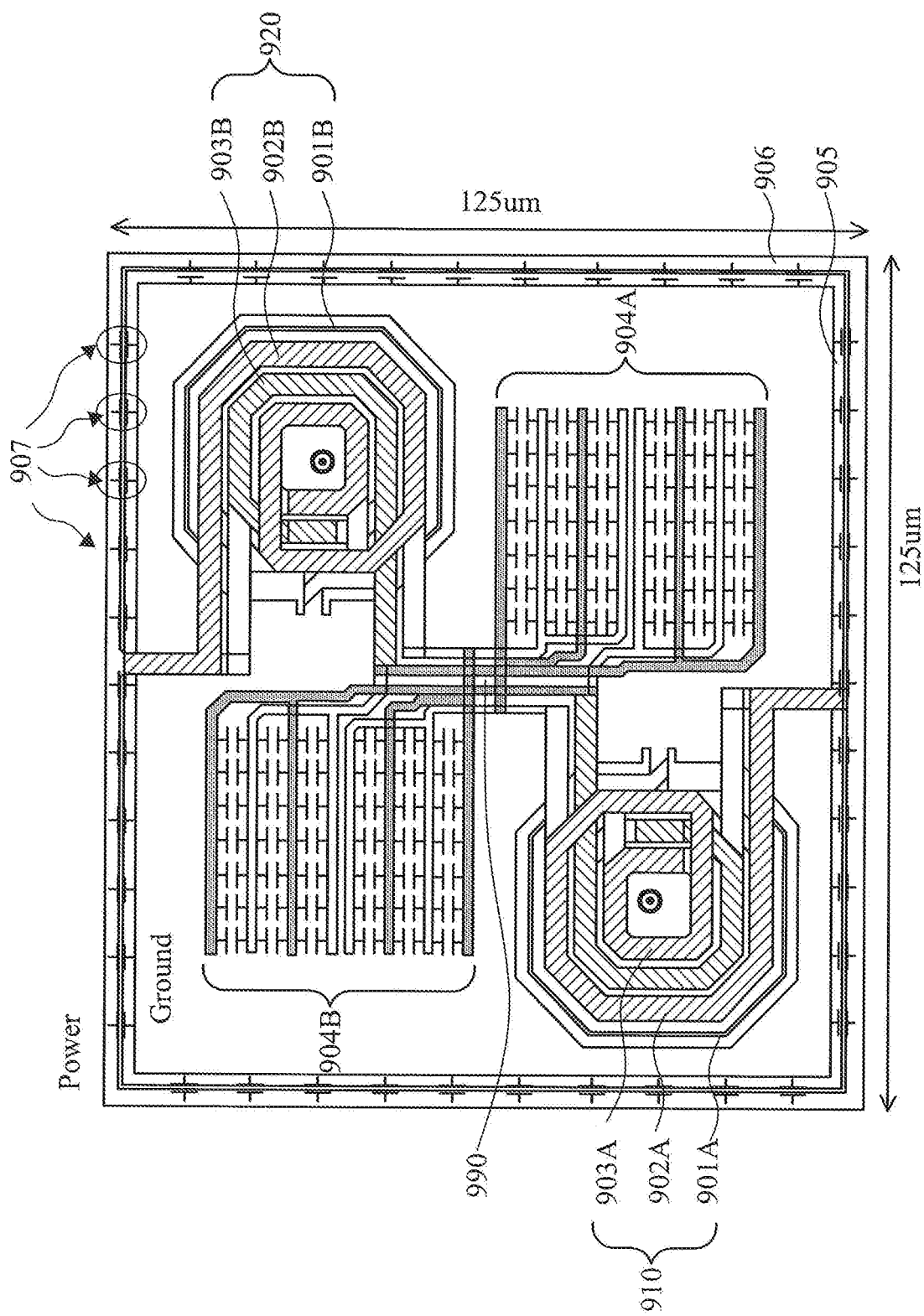

ADJUSTABLE MULTI-TURN MAGNETIC COUPLING DEVICE

CROSS REFERENCE TO RELATED APPLICATIONS

This application is a continuation of U.S. patent application Ser. No. 15/151,098, filed 10 May 2016, which is a utility of and claims priority to provisional application entitled "Adjustable Multi-Turn Magnetic Coupling Technique For LC-Based DCO", Application No. 62/269,699, filed on 18 Dec. 2015, the entirety of which are incorporated herein by reference.

BACKGROUND

All-digital phase-lock-loops (ADPLLs) are widely used in advanced CMOS technology. ADPLLs typically include high resolution time-to-digital converters (TDC) and LC-based digitally controlled oscillators (LC-DCO). Such configuration reduces area consumption and power dissipation in the ADPLL. The ADPLL also typically includes a digital loop filter, a reference clock accumulator, a variable clock accumulator and a feedback divider.

Compared to analog phase lock loops, an ADPLL with an LC-DCO exhibits lower phase noise with lower power consumption and lower frequency pushing (i.e., smaller output frequency variations due to supply voltage variation and/or noise). In addition, the LC-DCO is generally immune from process and temperature variations. The ADPLL with an LC-DCO, however, has a relatively smaller tuning range and occupies a relatively large space on the chip when compared to analog PLLs, for example.

Magnetic coupling techniques can be used for increasing the tuning range without extra area consumption by an LC-DCO by decreasing the inductance of an inductor or transformer-based LC tank of the LC-DCO. Implementations with a single-turn and fixed switches, however, provide a limited tuning range extension. Additionally, such magnetic coupling techniques decrease the total quality factor of the LC tank of the LC DCO due to a switch resistor coupling effect.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIG. 2A is a layout diagram illustrating a multi-turn magnetic coupling transformer with the number of turns N=2 in accordance with some embodiments.

FIG. 2B is a layout diagram illustrating a multi-turn magnetic coupling transformer with the number of turns N=3 in accordance with some embodiments.

FIG. 4A is a layout diagram illustrating a top coupling in accordance with some embodiments.

FIG. 4B is a layout diagram illustrating a bottom coupling in accordance with some embodiments.

FIG. 4C is a layout diagram illustrating a vertical top-bottom coupling in accordance with some embodiments.

FIG. 9 is a layout diagram illustrating the point-symmetric pseudo-differential layout corresponding to the circuit implementation of an adjustable multi-turn magnetic coupling transformer in FIG. 8A in accordance with some embodiments.

DETAILED DESCRIPTION OF EXEMPLARY EMBODIMENTS

Figure 1A:
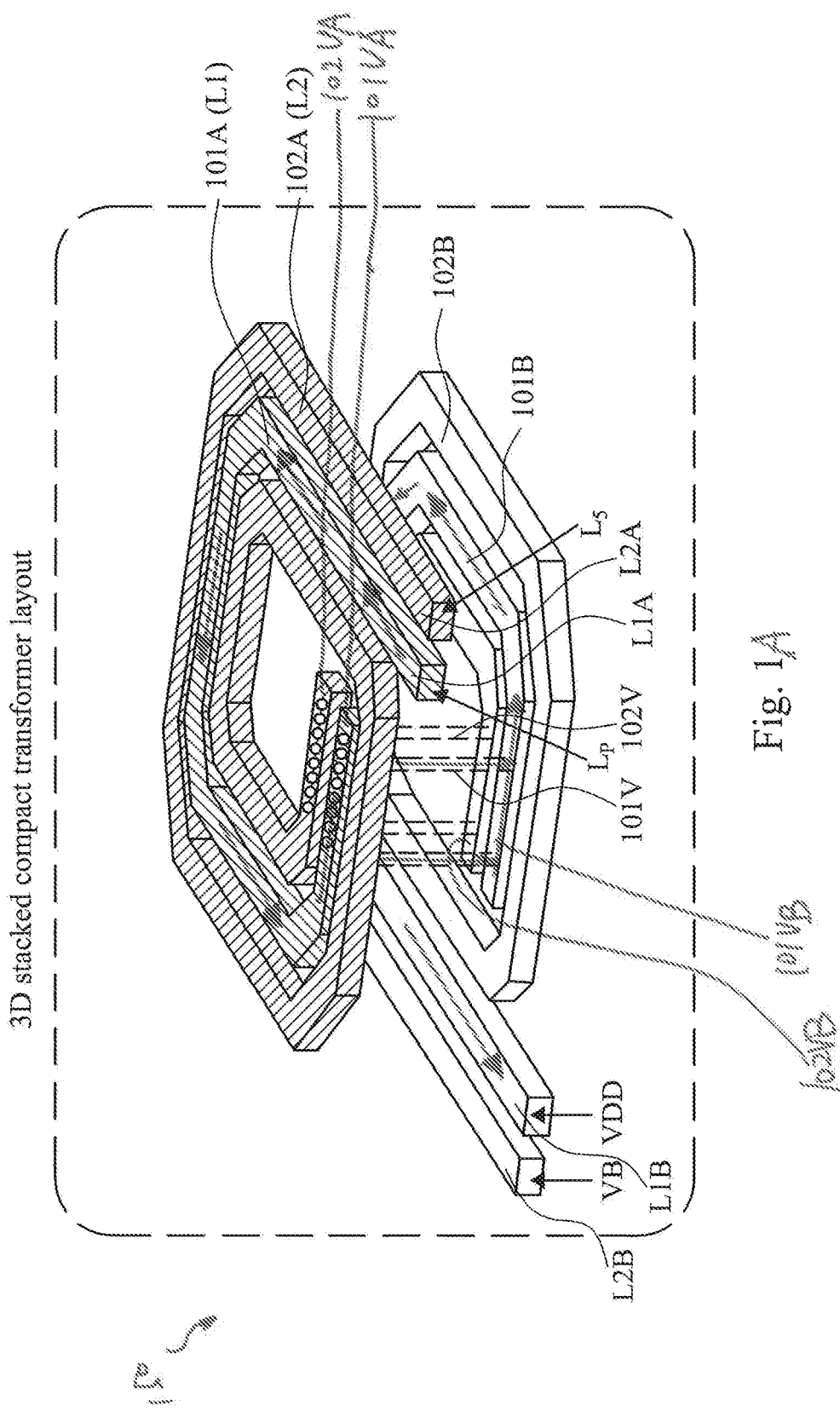
FIG. 1A is a three dimensional view of a stacked compact transformer layout with two inductors $L_1$ and $L_2$ in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

FIG. 1A is a three dimensional layout view of a stacked compact transformer 150 that includes two inductors, a first inductor ($L_1$) 101 and a second inductor ($L_2$) 102, in accordance with some embodiments. According to some embodiments, both the first and second inductors 101 and 102 are deployed in two tiers: tier A and tier B. In some embodiments, tier A and tier B are parallel to each other. According to some embodiments, the tier A portion of the first inductor 101A runs counter clockwise, while the tier B portion of the first inductor 101B also runs counter clockwise. According to some embodiments, the inner end of coil 101A is 101VA, and the inner end of 101B is 101VB. The inner ends 101VA and 101VB are aligned, and a plurality of vias, i.e. 101V, are implemented to electrically connect the inner end 101VA of coil 101A and the inner end 101VB of coil 101B across the tiers A and B. Similarly, a plurality of vias 102V are implemented to electrically connect the inner end 102VA of coil 102A and the inner end 102VB of coil 102B.

According to some embodiments, when the coils 101A and 101B are connected by vias 101V to form the inductor 101, the electrical current flows in to the inductor 101 from the L1A end and then counter clockwise to the inner end 101VA. After crossing from tier A to tier B through the vias 101V, the current flows counter clockwise from the inner end 101VB to the L1B end. Similarly, electrical current flows in to the inductor 102 from the L2A end and flows out from the L2B end.

Figure 1C:
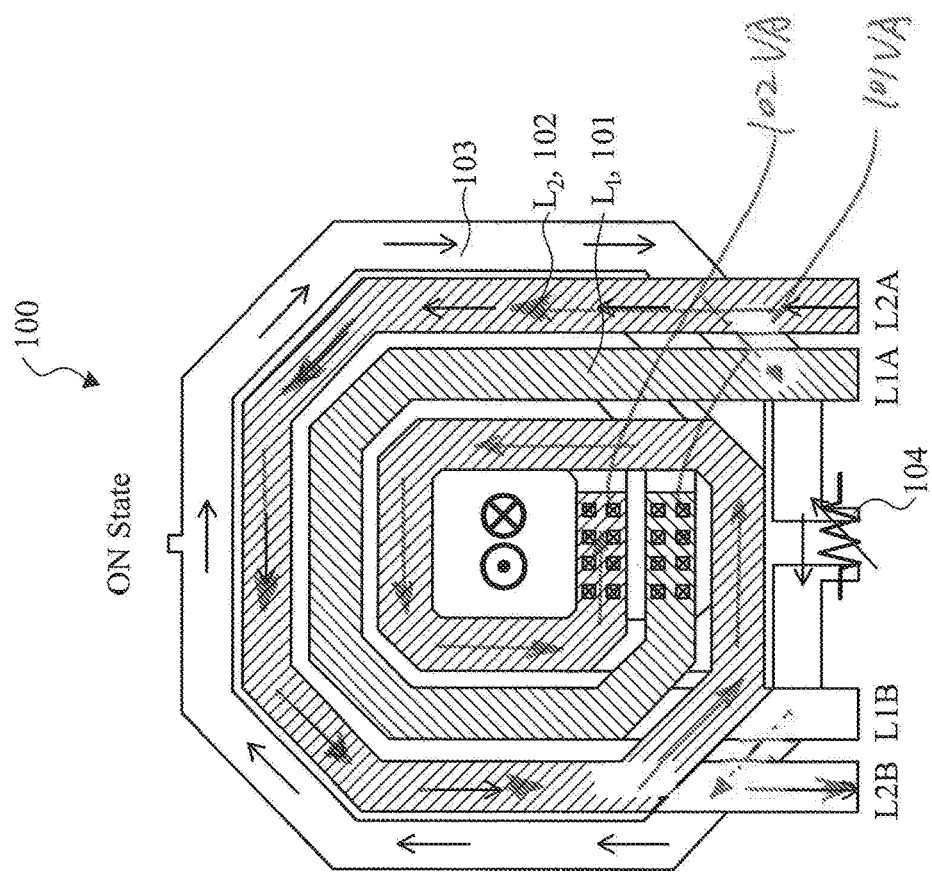
FIG. 1C is a layout diagram illustrating the ON state of a multi-turn magnetic coupling transformer in accordance with some embodiments.
Figure 1B:
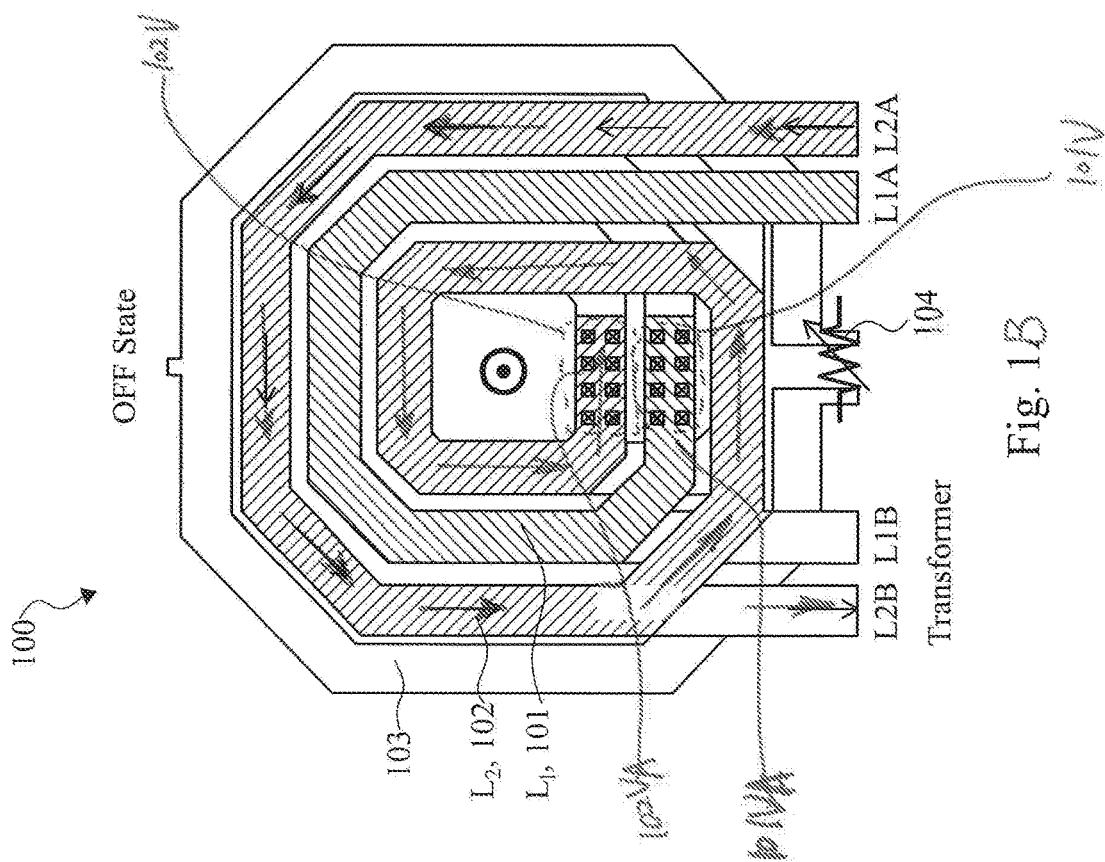
FIG. 1B is a layout diagram illustrating the OFF state of a multi-turn magnetic coupling transformer in accordance with some embodiments.

FIG. 1B is a layout diagram illustrating a transformer 100 having a first inductor 101 ($L_1$), a second inductor 102 ($L_2$) and a magnetic coupling ring 103 disposed outside and adjacent to the first and second inductors 101 and 102, respectively. According to some embodiments, the first inductor $L_1$ 101 and the second inductor $L_2$ 102 have the three dimensional layout illustrated in FIG. 1A. FIG. 1B illustrates a top view of the first inductor $L_1$ 101 and the second inductor $L_2$ 102 with the magnetic coupling ring 103 disposed outside. In the present top view, the coils 101A and 102A in the tier A overlap on the top of the coils 101B and 102B in the tier B. As explained in FIG. 1A above, electrical current flows in to the L2A end of the inductor 102 and flows counter clockwise. When the current reaches the inner end 102VA, the current crosses from the tier A to the tier B through the vias 102V. In this top view, the flow of electrical current in tier B is not visible because it is overlapped by tier A. The electrical current exits the inductor 102 at the L2B end. Similarly, the electrical current flows in to the inductor 101 from the L1A end and flows out from the L1B end.

The transformer 100 can be used in an LC-DCO, for example, in accordance with some embodiments. One or more turns (N≥1) of magnetic coupling provided by the magnetic coupling ring 103 can be implemented to enhance the magnetic field cancellation effect, thus to enhance the operation frequency of the DCO. In the embodiment illustrated in FIGS. 1B and 1C, the magnetic coupling ring 103 has only a single turn 103 (N=1). An increase in turns can produce a larger magnetic field for cancelling the magnetic field produced by the first and second inductors 101 and 102, which results in a smaller total inductance of the transformer 100, as discussed in further detail below. According to some embodiments, a variable switch 104 (represented as a variable resistor in the figures) controls the ON and OFF states of the magnetic coupling ring 103. According to some embodiments, the variable switch 104 includes more than one switch. A fixed switch can only be switched between two states: ON and OFF. As a comparison, a variable switch can have one or more states between ON and OFF so that the switch can be in a partially ON state. The variable switch will be discussed with FIGS. 5A-5D, 6A-6B, and 7 below. When the variable switch 104 is switched to the OFF state, no current flows in the magnetic coupling ring 103. When the variable switch 104 is switched ON, current flows in the magnetic coupling ring 103.

In FIG. 1B, the second inductor 102 is turned on such that AC current is running through it. However, the magnetic coupling ring 103 is in the OFF state such that no electrical current flows in the magnetic coupling turn 101. As a result, no additional magnetic field is generated by the magnetic coupling turn 101. As shown in FIG. 1B, the second inductor 102 is disposed inside the magnetic coupling ring 103 and electrical current flows counter clock-wise in the second $L_2$ inductor 102 to generate a magnetic field. The first $L_1$ inductor 101 is disposed inside the second $L_2$ inductor 102. As discussed in further detail below, the magnetic coupling turn(s) 103 can be switched ON and OFF by variable switch 104, for example, to decrease the total magnetic field of the transformer 100 and increase the tuning range of a LC-DCO. According to some embodiments, the $L_1$ inductor 101 and the $L_2$ inductor 102 couple to form a 4-port transformer according to Faraday's law.

The four ports are designated as L1A, L2A, L1B and L1B, where L1A is the input port of the first $L_1$ inductor 101, L1B is the output port of the first $L_1$ inductor 101, L2A is the input port of the second $L_2$ inductor 102, and L2B is the output port of the second $L_2$ inductor 102. The inductors 101 and 102 are illustrated in different shades in FIGS. 1B, 1C, and all subsequent figures. The direction of the magnetic field generated by current flow in the second $L_2$ inductor 102 is illustrated as ⊙ in the center of the turns, which means the direction of the magnetic field points downward into the turn (i.e., perpendicularly into the plane of the page). When current flows in the inductors 101 and 102, they magnetically couple to form a transformer. According to some embodiments, the dimensions (e.g., length, width, thickness) of the inductors 101 and 102 and the magnetic coupling ring 103 are in the micron scale as shown in FIG. 9, for example.

When the magnetic coupling ring 103 is switched OFF, the magnetic coupling ring 103 does not generate an additional magnetic field. When the magnetic coupling ring 103 is switched ON, the magnetic coupling ring 103 generates a magnetic field in a direction opposite to the magnetic field generated by the current in the inductors 101 and 102 to decrease the overall magnetic field of the transformer 100.

FIG. 1C is a layout diagram illustrating the ON state of the magnetic coupling ring 103, in accordance with some embodiments. In the ON state, the magnetic coupling ring 103 is switched to an ON state by an appropriate switching mechanism. When switched ON, the electrical current flows clockwise inside the magnetic coupling ring 103, which generates a magnetic field opposite to the magnetic field generated by the electrical current in the $L_2$ turn or inductor 102. The direction of the magnetic field generated by the electrical current in the magnetic coupling ring 103 is illustrated as a cross with a circle in the center of the turns, which is perpendicular out of the plane of the page. According to some embodiments, the switching mechanism for the magnetic coupling ring 103 can be a MOS transistor, or bipolar junction transistor, or a combination of MOS transistors and bipolar junction transistors.

According to some embodiments, the total magnetic field $B_{TOTAL}=B_{TF}-B_{MC}$, where $B_{TF}$ is the magnetic field generated by the transformer formed by the first and second inductors 101 and 102, respectively, and $B_{MC}$ is the magnetic field generated by the magnetic coupling ring 103. The magnetic coupling field $B_{MC}$ is proportional to the coupling coefficient $K_M$, such that $B_{MC} \propto I\,K_M$, where I is the current through the magnetic coupling ring 103 and the magnetic coupling coefficient $K_M$ is limited by the spacing of the metal design rules. When the spacing between the second inductor 102 and the magnetic coupling ring 103 decreases, $K_M$ increases. From the relationship $B_{MC} \propto I\,K_M$, in order to maximize $B_{MC}$, I should be maximized, which in turn suggests that the resistance of the switching mechanism be minimized. According to some embodiments, when MOS transistors are implemented as switching mechanisms, then the MOS switch resistance Ron should be minimized.

According to some embodiments, by switching ON the magnetic coupling ring 103, the total magnetic field $B_{TOTAL}$ is reduced, which results in a decrease in the mutual inductance (L) of the transformer (comprising inductors $L_1$ 101 and $L_2$ 102). According to the formula: $f_{osc}=1/[2\pi\cdot\text{Sqrt}(L\cdot C)]$, when L decreases, $f_{osc}$ increases. More specifically, when L decreases 33%, $f_{osc}$ increases approximately 25%. When the magnetic coupling is not turned on, the tuning range of the LC-based digitally controlled oscillators (LC-DCO) is 10 GHz-17 GHz. When the magnetic coupling is turned on and L is reduced by 33%, the frequency turning range is increased to 10 HGz~20 GHz, an approximately 25% increase.

FIG. 2A is a layout diagram illustrating a transformer 200 having a first $L_1$ inductor 201, a second $L_2$ inductor 202 and a two-turn (N=2) magnetic coupling ring 203, in accordance with some embodiments. The inductors 201 and 202 have similar three dimensional layout as illustrated in FIG. 1A. The magnetic coupling inductor 203 includes a first magnetic coupling turn 203A and a second magnetic coupling turn 203B disposed inside the first magnetic coupling turn 203A. The magnetic coupling turns 203A and 203B form the magnetic coupling ring 203 that is controlled by the variable switch 204. The first and second magnetic coupling turns 203A and 203B are connected so that the current flows in the same direction in both turns. According to some embodiments, when the magnetic coupling ring 203 is switched to the ON state (i.e., when the variable switch 204 is turned ON), electrical current flows inside the magnetic coupling turns 203A and 203B in a direction opposite the direction of the electrical current inside the first and second inductors 201 and 202, respectively. As a result, the magnetic field generated by the AC current in the magnetic coupling turns 203A and 203B is in the opposite direction of the magnetic field generated by the AC current in the first and second inductors 201 and 202. Thus, the alternating current (AC) flow in the magnetic coupling turns 203A and 203B are approximately 180 degrees out of phase with respect to the AC current flow in the first and second inductors 201 and 202. Thus, according to Lenzs law, the two magnetic field have a cancellation effect upon each other and reduce the total magnetic field of the transformer 200, which results in a reduction in total inductance (L) of the transformer 200. As discussed above with respect to FIGS. 1B and 1C, when the inductance is reduced, the frequency tuning range is extended approximately 25%.

FIG. 2B is a layout diagram illustrating a transformer 210 having a first $L_1$ inductor 211, a second $L_2$ inductor 212 and a three-turn (N=3) magnetic coupling ring 213, in accordance with some embodiments. The inductors 211 and 212 have similar three dimensional layout as illustrated in FIG. 1A. In addition to the two magnetic coupling turns 213A and 213B, a third magnetic coupling turn 213C is disposed outside the magnetic coupling turns 213A and 213B. The magnetic coupling turns 213A, 213B and 213C form the magnetic coupling ring 213 controlled by the variable switch 214. The magnetic coupling turns 213A, 213B and 213C are all connected so that, when all three magnetic coupling turns are switched to the ON (or partial ON) state, electrical AC current flows inside the magnetic coupling turns 213A, 213B and 213C in the same direction. As a result, magnetic field is generated by the magnetic coupling turns 213A, 213B and 213C. Thus, the alternating current (AC) flow in the magnetic coupling turns 213A, 213B and 213C are approximately 180 degrees out of phase with respect to the AC current flow in the first and second inductors 201 and 202. According to some embodiments, the direction of the magnetic field generated by the magnetic coupling turns 213A, 213B and 213C is opposite to the magnetic field generated by the inductors 211 and 212. Similar to the discussion it FIGS. 1B and 1C, the $L_1$ inductor 211 and $L_2$ inductor 212 of the are illustrated in different shades.

Figure 2C:
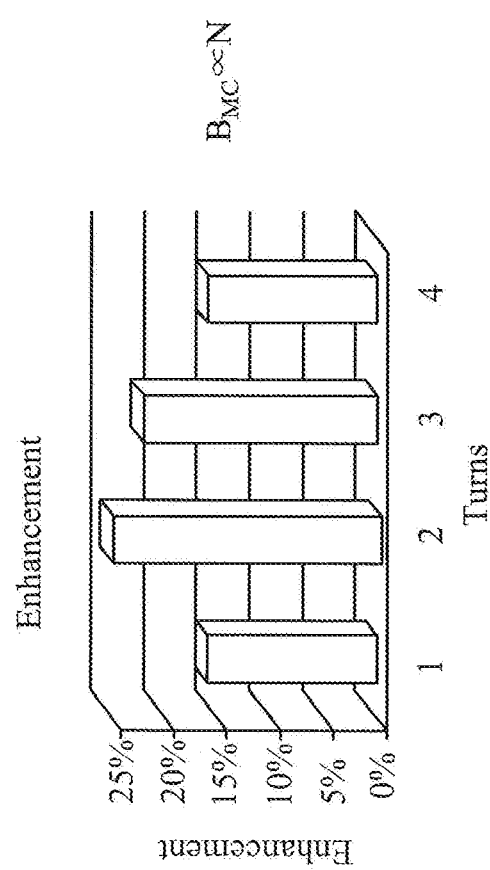
FIG. 2C is a bar graph chart illustrating a comparison of performance enhancement of N=1, 2 and 3 in accordance with some embodiments.

FIG. 2C is a bar graph chart illustrating a comparison of performance enhancement when the magnetic coupling ring has one, two and three turns (N=1, 2 and 3), in accordance with some embodiments. The performance is measured by the extension of the frequency tuning range as a percentage. As illustrated in the figure, the performance enhancement reaches a maximum value of about 24% when the number of turns is N=2. When the number of turns increases to N=3, parasitic capacitance is induced and the performance enhancement drops to around 21%. When the number of turns further increases to N=4, further parasitic capacitance is induced and the performance enhancement further decreases to around 15%, which is close to the same level when N=1. According to some embodiments, N=2 reaches the optimal enhancement of the performance for the embodiments and configurations illustrated in FIGS. 1A-2B. According to alternative embodiments, the magnetic coupling ring can be disposed adjacent to the inductors $L_1$ and/or $L_2$ in alternative configurations, and N can be any integer number larger than 1.

Figure 3A:
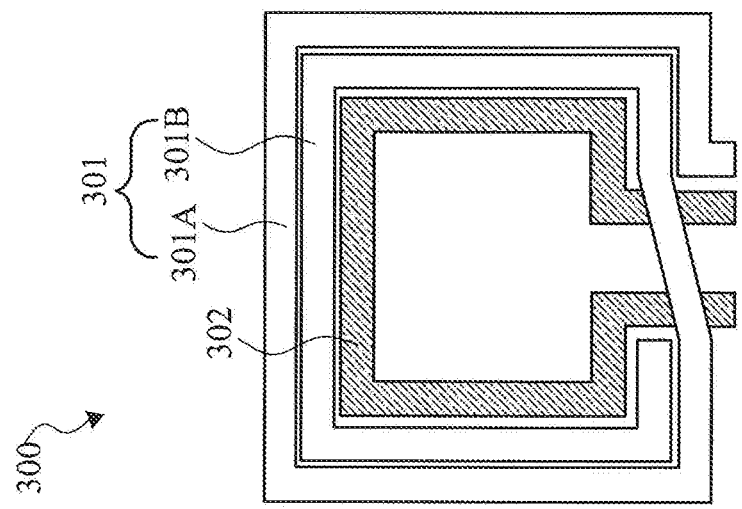
FIG. 3A is a layout diagram illustrating an outside coupling in accordance with some embodiments.

FIG. 3A is a layout diagram illustrating a transformer 300 having a transformer/inductor 302 and two outside magnetic coupling turns 301A and 301B in accordance with some embodiments. The magnetic coupling turns 301A and 301B form a magnetic coupling ring 301. The transformer/inductor 302 can be an inductor or transformer but is illustrated as a single turn inductor for purposes of simplicity. The magnetic coupling turns 301A and 301B are outside coupling turns disposed outside the inductor or transformer 302, which means that both the magnetic coupling turns 301A and 301B have larger sizes than the transformer 302. According to some embodiments, the turn 302 is a transformer which has two inductors (not illustrated in FIG. 3A) similar to the embodiments in FIGS. 1B and 1C. According to some embodiments, the transformer/inductor 302 is a transformer which has more than two inductors. According to some embodiments, the magnetic coupling turns 301A and 301B magnetically couple with the transformer/inductor 302 to form the transformer 300. According to some embodiments, the magnetic coupling turns 301A, 301B and transformer/inductor 302 are all in the same plane or layer of an integrated circuit. The magnetic coupling turns 301A and 301B are electrically connected to allow electrical current to flow through both of them in the same direction. According to some embodiments, additional turns can be added to the transformer/inductor 302. According to some embodiments, additional turns can be added outside the transformer/inductor 302, and electrically connected to magnetic turns 301A and 301B to form a magnetic coupling ring with more turns. In some embodiments, the space between the transformer/inductor 302 and magnetic turns 301A, 301B is filled with non-magnetic material.

Figure 3C:
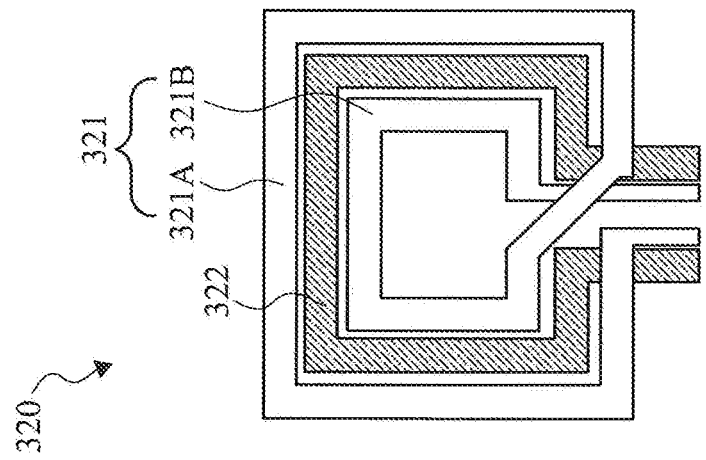
FIG. 3C is a layout diagram illustrating a surface inside-outside coupling in accordance with some embodiments.
Figure 3B:
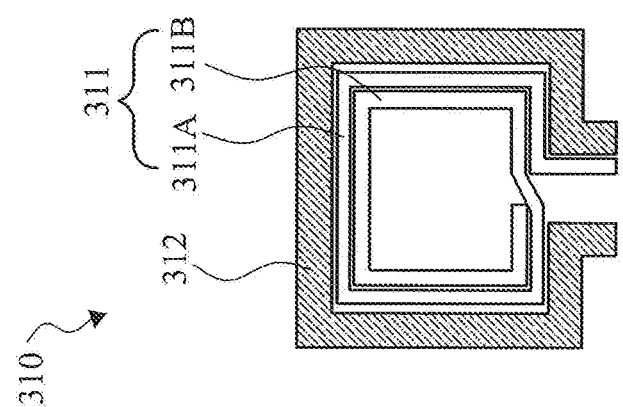
FIG. 3B is a layout diagram illustrating an inside coupling in accordance with some embodiments.

FIG. 3B is a layout diagram illustrating a transformer 310 having a transformer/inductor 312 and two inside magnetic coupling turns 311A and 311B, in accordance with some embodiments. The magnetic coupling turns 311A and 311B form a magnetic coupling ring 311. The transformer/inductor 312 is an inductor, or a transformer, the magnetic coupling turns 311A and 311B are inside coupling turns disposed inside the transformer/inductor 312, which means that both of the magnetic coupling turns 311A and 311B have smaller sizes than the transformer 312. According to some embodiments, the magnetic coupling turns 311A and 311B magnetically couple with the transformer/inductor 312 to form the transformer 310. According to some embodiments, the magnetic coupling turns 311A, 311B and transformer/inductor 312 are all planar turns formed on the same plane or layer in an integrated circuit. The magnetic coupling turns 311A and 311B are electrically connected to allow electrical current to flow through both of them in the same direction. According to some embodiments, additional turns can be added to the transformer/inductor 312. According to some embodiments, additional turns can be added inside the transformer/inductor 312, and electrically connected to the magnetic coupling turns 311A and 311B to form a magnetic coupling ring with more turns. In some embodiments, the space between the transformer/inductor 312 and the magnetic coupling turns 311A and 311B is filled with non-magnetic material.

FIG. 3C is a layout diagram illustrating a transformer 320 having a transformer/inductor 322, an outside magnetic coupling turn 321A and an inside magnetic coupling turn 321B, in accordance with some embodiments. The magnetic coupling turns 321A and 321B form a magnetic coupling ring 321. The magnetic coupling turn 321A is an outside coupling turn disposed outside the transformer/inductor 322, which means that the magnetic coupling turn 321A has a larger size than the transformer/inductor 322. The magnetic coupling turn 321B is an inside coupling turn disposed inside the inductor 322, which means that the magnetic coupling turn 321B has a smaller size than the transformer/inductor 322. The magnetic coupling turns 321A and 321B are electrically connected to allow electrical current to flow through both of them in the same direction. According to some embodiments, the magnetic coupling turns 321A, 321B and transformer/inductor 322 are all in the same plane. According to some embodiments, additional turns can be added to the transformer/inductor 322. According to some embodiments, additional turns can be added outside the transformer/inductor 322. According to some embodiments, additional turns can be added inside the transformer/inductor 322, and electrically connected to the magnetic coupling turns 321A and 321B to form a magnetic coupling ring with more turns.

According to some embodiments, the layouts in FIGS. 3A, 3B and 3C are referred to herein as "edge coupling" because all magnetic coupling turns and transformer turns are planer turns disposed on the same planar surface or layer of an integrated circuit device. As discussed above, the transformer/inductor 322 and the magnetic coupling turns 321A and 321B can magnetically couple to one another to form one or more transformers. According to some embodiments, the inductors/transformers could be 4-port transformers/inductors, a 6-port trifilar, multi-port (8-port, 10-port, or N-port) transformers, or any layout of devices that can generate magnetic fields. In some embodiments, the space between the transformer/inductors 322 and the magnetic coupling turns 321A and 321B is filled with a non-magnetic material. In alternative embodiments, however, the magnetic coupling turns need not be in the same plane as the turn(s) of the primary inductor or transformer.

FIG. 4A is a three-dimensional (3-D) layout diagram illustrating a transformer 400 having a transformer/inductor 402 and two magnetic coupling turns 401A and 401B disposed on the outside and above the transformer/inductor 402, in accordance with some embodiments. The magnetic coupling turns 401A and 401B form a magnetic coupling ring 401. According to some embodiments, the transformer/inductor 402 is a transformer which has two inductors $L_1$ and $L_2$ (not illustrated in FIG. 4A) similar to the embodiments illustrated in FIGS. 1A 1B and 1C. According to some embodiments, the transformer/inductor 402 is a transformer which has more than two inductors. The magnetic coupling turns 401A and 401B are top coupling turns above the transformer/inductor 402, which means that both the magnetic coupling turns 401A and 401B are raised above the transformer/inductor 402. According to some embodiments, the magnetic coupling turns 401A and 401B have larger sizes than the transformer/inductor 402. According to some embodiments, the magnetic coupling turns 401A and 401B have smaller sizes than the transformer/inductor 402. According to some embodiments, the magnetic coupling turns 401A and 401B have the same sizes as the transformer/inductor 402. According to some embodiments, one of the magnetic coupling turns 401A and 401B has a larger size than the transformer/inductor 402. According to some embodiments, one of the magnetic coupling turns 401A and 401B has a smaller size than the transformer/inductor 402. According to some embodiments, one of the magnetic coupling turns 401A and 401B has the same size as the transformer/inductor 402. The magnetic coupling turns 401A and 401B are electrically connected to allow electrical current to flow through both of them. According to some embodiments, additional turns can be added to the transformer/inductor 402. According to some embodiments, additional turns can be added above the transformer/inductor 402, and electrically connected to the magnetic coupling turns 401A and 401B to form a magnetic coupling ring with more turns. As discussed above, the transformer/inductors 402 and the magnetic coupling turns 401A, 401B can magnetically couple to one another to form one or more transformers 400. In some embodiments, the space between the transformer/inductors 402 and the magnetic coupling turns 401A and 401B is filled with non-magnetic material as space filler.

FIG. 4B is a layout diagram illustrating a transformer 410 having a transformer/inductor 412 and two magnetic coupling turns 411A and 411B disposed outside and below the turn(s) of the transformer/inductor 412, in accordance with some embodiments. The magnetic coupling turns 411A and 411B form a magnetic coupling ring 411. According to some embodiments, the magnetic coupling turns 411A and 411B have larger sizes than the transformer/inductor 412. According to some embodiments, the magnetic coupling turns 411A and 411B have smaller sizes than the transformer/inductor 412. According to some embodiments, the magnetic coupling turns 411A and 411B have the same sizes as the transformer/inductor 412. According to some embodiments, one of the magnetic coupling turns 411A and 411B has a larger size than the transformer/inductor 412. According to some embodiments, one of the magnetic coupling turns 411A and 411B has a smaller size than the transformer/inductor 412. According to some embodiments, one of the magnetic coupling turns 411A and 411B has the same size as the transformer/inductor 412. The magnetic coupling turns 411A and 411B are electrically connected to allow electrical current to flow through both of them. According to some embodiments, additional turns can be added to the transformer/inductor 412. According to some embodiments, additional turns can be added above the transformer/inductor 412, and electrically connected to the magnetic coupling turns 411A and 411B to form a magnetic coupling ring with more turns. The transformer/inductors 412, the magnetic coupling turns 411A and 411B can magnetically couple to one another to form one or more transformers 410. In some embodiments, the space between the transformer/inductor 412 and the magnetic coupling turns 411A, 411B is filled with non-magnetic material.

FIG. 4C is a layout diagram illustrating a transformer 420 having a transformer/inductor 422 and a top magnetic coupling turn 421A and a bottom magnetic coupling turn 421B in accordance with some embodiments. The magnetic coupling turns 421A and 421B form a magnetic coupling ring 421. The transformer/inductor 422 is either a transformer or an inductor, the magnetic coupling turn 421A is a coupling turn disposed outside and above the transformer/inductor 422, which means that the magnetic coupling turns 421A is larger and raised above the transformer/inductor 422. The magnetic coupling turn 421B is a coupling turn disposed outside and below the transformer/inductor 422, which means that the magnetic coupling turn 421B is larger and located below the transformer/inductor 422. According to some embodiments, the magnetic coupling turns 421A and 421B have larger sizes than the transformer/inductor 422. According to some embodiments, the magnetic coupling turns 421A and 421B have smaller sizes than the transformer/inductor 422. According to some embodiments, the magnetic coupling turns 421A and 421B have the same sizes as the transformer/inductor 422. According to some embodiments, one of the magnetic coupling turns 421A and 421B has a larger size than the transformer/inductor 422. According to some embodiments, one of the magnetic coupling turns 421A and 421B has a smaller size than the transformer/inductor 422. According to some embodiments, one of the magnetic coupling turns 421A and 421B has the same size as the transformer/inductor 422. The magnetic coupling turn 421A and 421B are electrically connected to allow electrical current to flow through both of them. According to some embodiments, additional turns can be added to the transformer/inductor 422. According to some embodiments, additional turns can be added above the transformer/inductor 422, and electrically connected to the magnetic coupling turns 421A and 421B to form a magnetic coupling ring with more turns.

According to some embodiments, the layouts illustrated in FIGS. 4A, 4B and 4C are referred to herein as "broadside coupling" because all magnetic coupling turns and inductor turns are not in the same planar surface. The transformer/inductors 422, the magnetic coupling turns 421A and 421B can magnetically couple to one another to form one or more transformers 420. In some embodiments, the space between the transformer/inductors 422 and the magnetic coupling turns 421A, 421B is filled with non-magnetic material.

According to some embodiments, the inductor/transformer could be 4-port transformers or inductors, 6-port trifilar, multi-port (8-port, 10-port, or N-port) transformers, or any layout of devices that could generate a magnetic field. According to some embodiments, each of the implementations in FIGS. 3A, 3B, 3C, can be combined with each the implementations in 4A, 4B and 4C. For example, outside magnetic turns can be added all above or all below a primary inductor, or some of the turns above the primary inductor and some of the turns below the primary inductor, or all on the same surface as the primary inductor. The same is true for inside turns. More generally, according to some embodiments, additional turns can be added above, below, inside or outside the primary inductor, additional turns can have the same size as the primary inductor, additional turns can be on the same surface as the primary inductor. Additional turns can be added as a combination of any the above configurations. According to some embodiments, the number of turns of the primary inductor is no smaller than 1. According to some embodiments, the number of turns of the magnetic coupling is no smaller than 2.

Figure 5A:
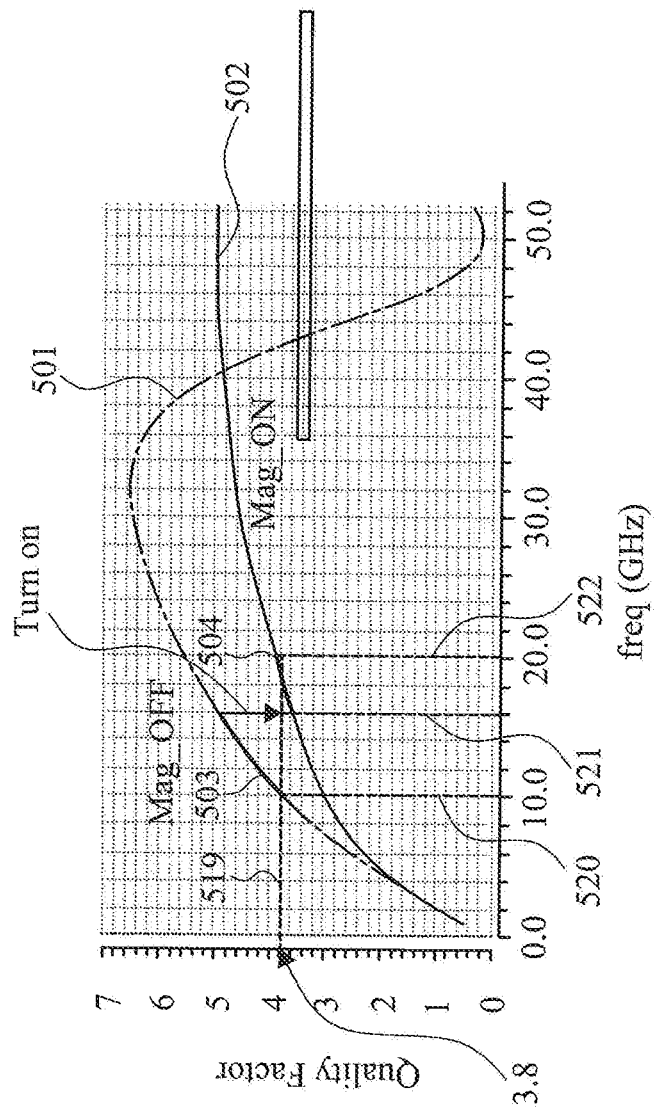
FIGS. 5A and 5B provide graphs illustrating the magnetic coupling switching-on effect on the quality factor of a single switch.
Figure 5B:
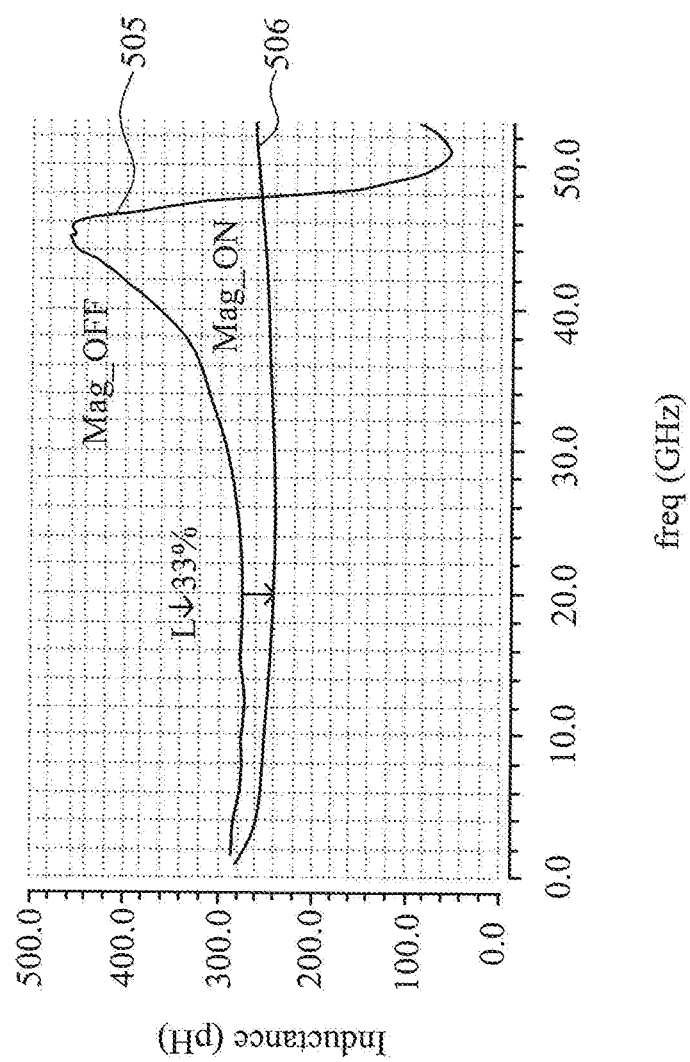

FIGS. 5A and 5B provide graphs illustrating the magnetic coupling switching-on effect on the quality factor of a single switch that controls the magnetic coupling ring. The horizontal axis is frequency in the unit of GHz, and the vertical axis is quality factor. Quality factor Q is defined as:

$$Q = \frac{\omega L}{R},$$

which means when inductance L decreases and resistance R increases, Q decreases. The oscillation frequency $f_{osc}$ is defined as:

$$f_{osc} = \frac{1}{2\pi\sqrt{LC}},$$

which means that with a decrease of L of approximately 33% (shown in FIG. 5B, between graphs 505 and 506), $f_{osc}$ increases approximately 25% thereby increasing the tuning range. The increase in tuning range is illustrated in FIG. 5A. The curve 501 illustrates the Quality-Frequency relationship when the magnetic coupling is switched off. When the magnetic coupling is switched off, the frequency tuning range of the inductors is from 10 GHz to 17 GHz. The darkened segment 503 of the curve 501 designates the Quality-Frequency relationship in the frequency range of 10 GHz 17 GHz (shown as between the dashed vertical lines 520, 521). The tuning range is 10 GHz~17 GHz due to the impact of parasitic current in the inductors when the switch is off. Therefore, the single switch must be turned ON to extend the tuning range beyond 17 GHz. When the switch is switched on, the curve 501 changes to curve 502, and the tuning range is extended to 10 GHz~20 GHz as shown between the vertical lines 520 and 522. Thus, a tuning range of 10 GHz~20 GHz is achieved when the magnetic coupling is introduced when the switch is on.

The magnetic coupling is switched on when the frequency approaches 17 GHz. When the magnetic coupling is switched on, the Quality-Frequency relationship drops from the darkened segment 503 on curve 501 to the darkened segment 504 on the curve 502. At 17 GHz, the corresponding quality factor on the darkened segment 504 drops below the lowest quality factor value of 3.8 on segment 503, which is designated by horizontal dashed line 519. As the frequency changes from 17 GHz to 20 GHz, the quality factor increases above 3.8, illustrated by the dashed line 519.

FIG. 5B illustrates the inductance change when the magnetic coupling is turned off (505), and when the magnetic coupling is turned on (506). At the frequency 20.0 GHz, the inductance drops about 33%.

Thus, the magnetic coupling provides more than 20% tuning frequency range enhancement. In the frequency range 10 GHz~17 GHz (illustrated as darkened segment 503 between the vertical lines 520 and 521), the lowest quality factor value is approximately 3.8. When the switch is switched on in the curve 502, the quality factor decreases approximately 32% due to magnetic coupling, but the tuning range is extended by approximately 20%. In the extended tuning range designated as darkened segment 504 in FIG. 5A, the quality of at least part of tuning range 504 is below the lowest quality value of 503, which is 3.8 (shown as horizontal dashed line 519).

Figure 5C:
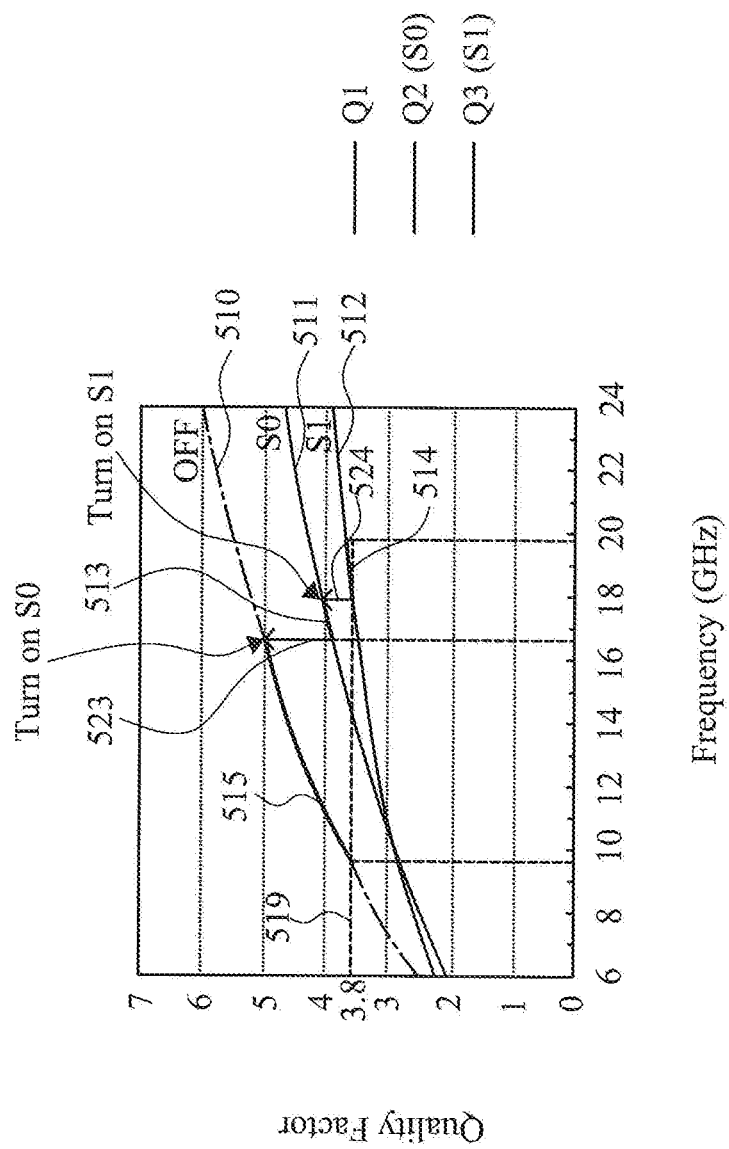
FIGS. 5C and 5D provide graphs illustrating the magnetic coupling switching-on effect on the quality factor of two switches.
Figure 5D:
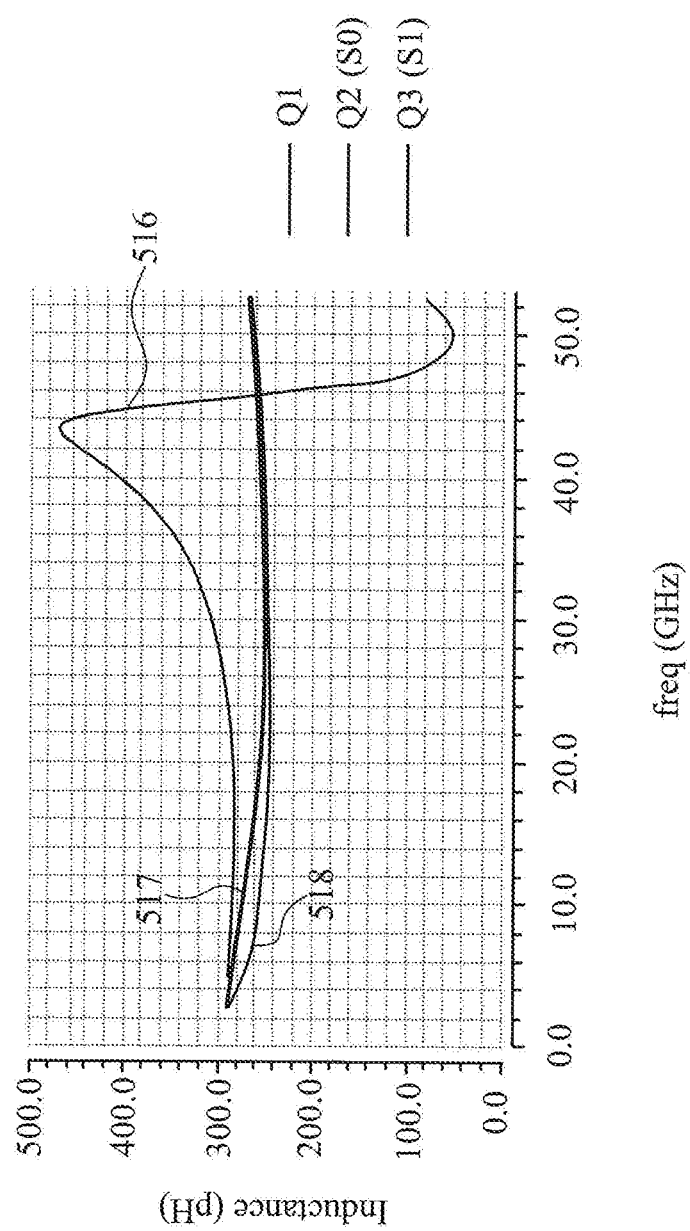

FIGS. 5C and 5D provide graphs illustrating the magnetic coupling switching-on effect on the quality factor of two switches. The curve 510 illustrates the Quality-Frequency relationship when the switches are all off. The curve 511 illustrates the Quality-Frequency relationship when one switch is switched on. The curve 512 illustrates the Quality-Frequency relationship when both switches are switched on. After using the two switches in the magnetic coupling, the magnetic quality factors of all graphs are higher than the lowest quality value of 3.8 shown as 519 in FIG. 5A without degrading the whole band performance. As compared to FIG. 5A, the frequency tuning range (10 GHz~17 GHz) is extended when one switch (S0) is switched on in curve 511, as shown by darkened segment 513 between vertical arrows 523 and 524. When the second switch (S1) is switched on, the tuning range is further extended to approximately 20 GHz as shown by darkened segment 514 on curve 512. As shown in FIG. 5C, the quality factor in the extended range 513 (on 511) and 514 (on 512) is higher than the lowest quality value of 3.8 in the frequency range of 10 GHz~17 GHz. (illustrated as horizontal dashed line 519). In some embodiments, overall, the quality factor is enhanced approximately 16% without degrading the performance of the whole band.

FIG. 5D illustrates the inductance change when the magnetic coupling is switched off (516), when one magnetic coupling is switched on (517), and when both magnetic coupling are switched on (518).

Figure 6B:
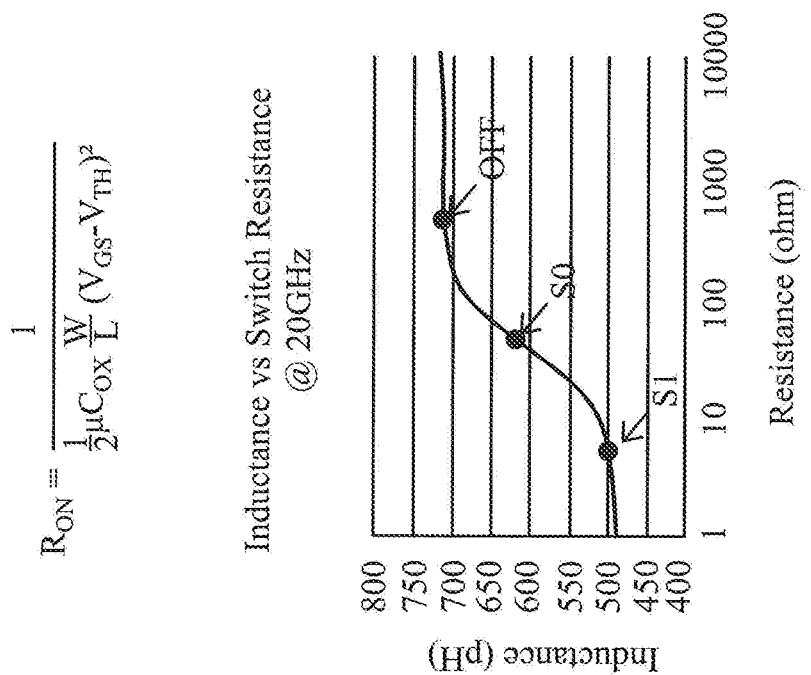
FIG. 6B is a graph illustrating a comparison of the inductance and switch resistance of an adjustable multi-turn magnetic coupling transformer with two switches in accordance with some embodiments.
Figure 6A:
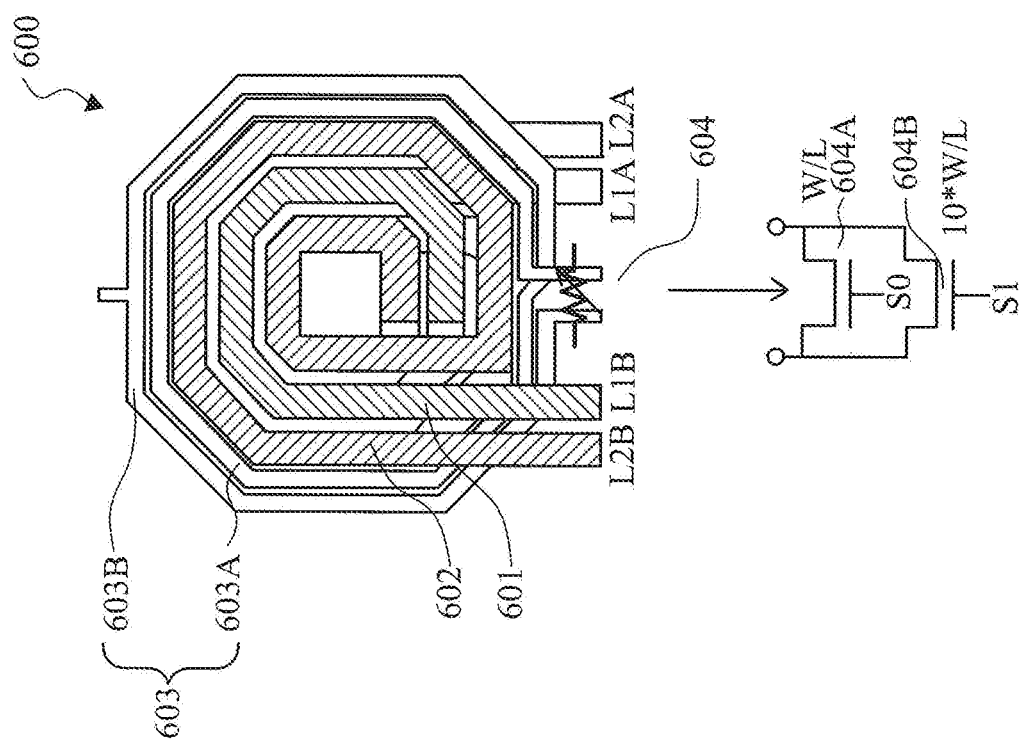
FIG. 6A is a layout diagram illustrating an adjustable multi-turn magnetic coupling transformer with two switches in accordance with some embodiments.

FIG. 6A is a layout diagram illustrating an adjustable multi-turn magnetic coupling transformer with two switches in accordance with some embodiments. The transformer 600 include a first inductor 601, a second inductor 602, a first magnetic coupling turn 603A, a second magnetic coupling turn 603B and a variable switch 604 with two transistors 604A and 604B. The inductors 601 and 602 have similar three dimensional layout as illustrated in FIG. 1A. According to some embodiments, adjustable MOS switches are implemented to change the inductance through digital control. The magnetic coupling turns 603A and 603B form the magnetic coupling ring 603. According to some embodiments, the quality factor of the whole band is enhanced. According to some embodiments, two turns 603A and 603B are implemented outside the two inductors 601 and 602 similar to the discussion in FIGS. 1A and 1B. Inductors 602 and 601 are illustrated in different shades similar to previous figures. Two transistors S0 604A and S1 604B are implemented as switches for the corresponding magnetic coupling turns 603A and 603B. When the corresponding transistor is switched ON, then the electrical current flows inside the corresponding turn. As a result, magnetic field is generated by the corresponding turn. According to some embodiments, the transistors are N-MOS transistors. According to some other embodiments, the transistors are P-MOS transistors. According to some embodiments, the transistors are a combination of P-MOS and N-MOS transistors. According to some embodiments, the transistors are controlled by corresponding control logic units. The size of the MOS transistor is measured by W/L, where W is the width of the MOS transistor and L is the length of the MOS transistor. According to some embodiments, the size of the S1 604B is 10 times that of the S0 604A. In some embodiments, the resistance of the MOS switches indicated by resistance symbol 604 is inversely proportional to the size of the MOS switches. The switch 604 is effectively a variable resistor formed by the MOS switches 604A and 604B.

FIG. 6B is a graph illustrating a comparison of the inductance and switch resistance of an adjustable multi-turn magnetic coupling transformer with two switches in accordance with some embodiments. The horizontal axis is resistance in the unit of ohms, and the vertical axis is inductance in the unit of pico Henries (pH). OFF designates the corresponding resistance and inductance when the transistors 603A and 603B are both switched off. S0 designates the corresponding resistance and inductance when the transistor 603A (S0) is switched on. S1 designates the corresponding resistance and inductance when both the transistors 603A (S0) and 603B (S1) are switched on. According to some embodiments, the resistance is:

$$R_{ON} = \frac{1}{\frac{1}{2}\mu_n C_{OX} \frac{W}{L}(V_{GS} - V_{TH})^2}.$$

Figure 7:
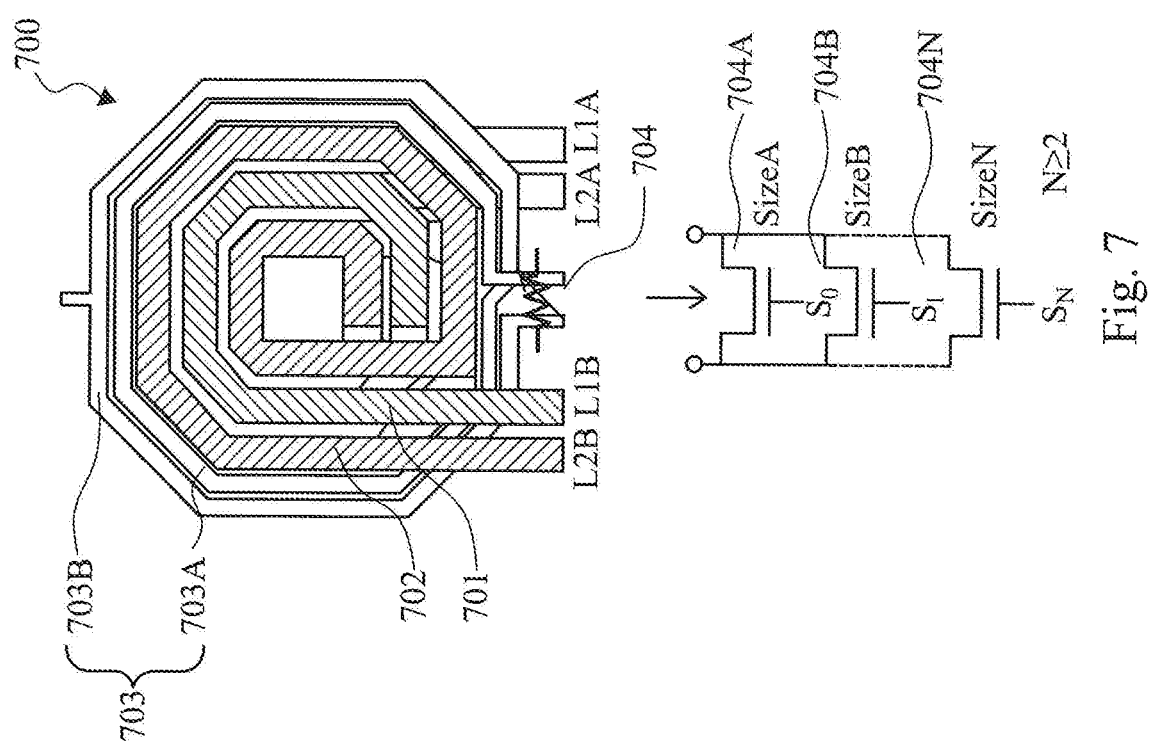
FIG. 7 is a layout diagram illustrating an adjustable multi-turn magnetic coupling transformer with NMOS switches in accordance with some embodiments.

FIG. 7 is a layout diagram illustrating an adjustable multi-turn magnetic coupling transformer 700 having a plurality of NMOS switches 704A-704N, in accordance with some embodiments. The transformer 700 include a first inductor 701, a second inductor 702, a first magnetic coupling turn 703A, a second magnetic coupling turn 703B and a variable switch 704 with N transistors 704A-704N. The inductors 701 and 702 have similar three dimensional layout as illustrated in FIG. 1A. The magnetic coupling turns 703A and 703B form the magnetic coupling ring 703. Similar to the discussion of FIGS. 6A and 6B, the magnetic coupling turns 703A and 703B are controlled by the variable switch 704 (shown as a variable resistor) implemented by N NMOS transistors connected as parallel switches. According to some embodiments, the sizes of the NMOS switches can be varied as desired. According to some embodiments, the relative sizes of the all the NMOS switches follow a binary sequence: 1, 2, 4, 8, 16, etc. from S0 to SN. According to some embodiments, the relative sizes of the all the NMOS switches follow a decimal sequence: 1, 10, 100, 1000, 10000, etc. from S0 to SN. In some embodiments, the resistance of the MOS switches indicated by variable resistor symbol 704 is inversely proportional to the size of the MOS switches. According to some embodiments, the variable switch 704 includes N PMOS transistors 704A, 704B, . . . 704N, and all discussions regarding variable switch with NMOS transistors above also apply to variable switch with PMOS transistors.

According to some embodiments, the N switches are of the same type. According to some embodiments, the N switches are of the different types. According to some embodiments, the N switches are a combination of NMOS, PMOS and bipolar junction transistors. In alternative embodiments, the N switches can be any type of switch device that can be turned on and off with a desired amount of resistance when turned on.

Figure 8A:
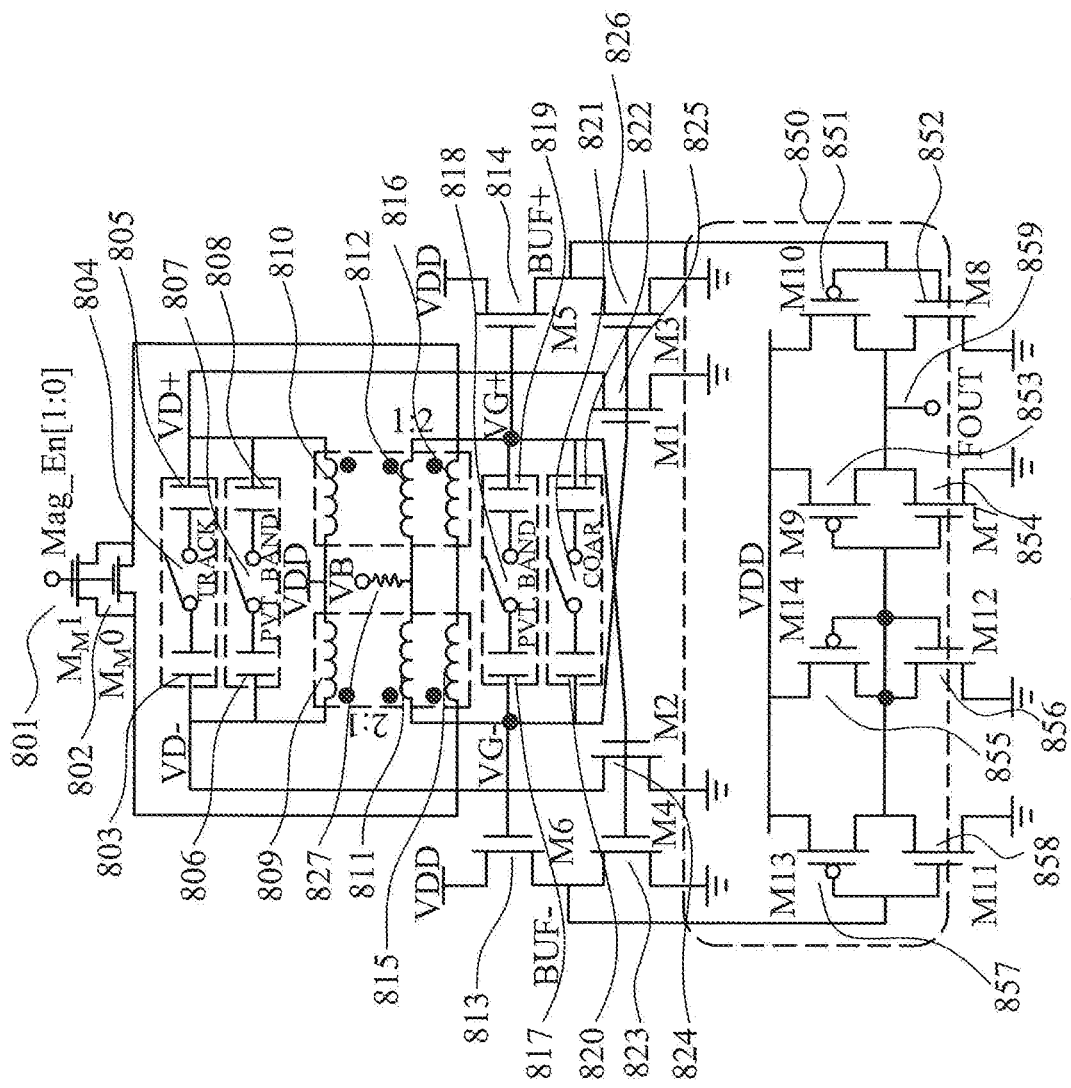
FIG. 8A is a schematic diagram illustrating the circuit implementation of an adjustable multi-turn magnetic coupling transformer in accordance with some embodiments.

FIG. 8A is a schematic diagram illustrating a circuit implementation of an adjustable multi-turn magnetic coupling transformer 800, in accordance with some embodiments. A first transistor 801 and a second transistor 802 are connected in parallel, and they are further connected to inductors 815 and 816 to form a loop. When either one of transistors 801 and 802, or both of them, is/are switched on, electrical current flows in the loop formed by the inductor 815, inductor 816, and transistors 801 and 802. The magnetic field generated by such electrical current is either in the same direction, or in the opposite direction of the transformer(s) in other parts of the circuits discussed below. Inductors 809 and 810 are connected in serial. Capacitors 803 and 805 are separated by a switch 804. Capacitors 806 and 808 are separated by a switch 807. In a similar configuration, inductors 811 and 812 are connected in serial. Capacitors 817 and 819 are separated by a switch 818. Capacitors 820 and 822 are separated by a switch 821. A resistor 827 is connected to a predetermined voltage supply (VB) at one end and to a node between inductors 811 and 812 at a second end. A capacitor 828 has one plate connected to ground and a second plate connected to the node between inductors 811 and 812.

According to some embodiments, the transistors 801 and 802 form a variable switch. The loop formed by the inductors 815 and 816 is the magnetic coupling ring, and the magnetic coupling ring is controlled by the variable switch including two transistors 801 and 802. According to some embodiments, there are a plurality of magnetic coupling turns in the magnetic coupling ring. According to some embodiments, the variable switch includes more than two transistors. According to some embodiments, the variable switch includes other switching devices. According to some embodiments, the inductors 809 and 810 form the $L_1$ inductor (for example, 101) and the inductors 811 and 812 form the $L_2$ inductor (for example 102), as illustrated in FIGS. 1B and 1C.

The gate of the transistor 813 is connected to the inductor 811. Similarly, the gate of the transistor 814 is connected to the inductor 812. The source of the transistor 813 is connected to the source of the transistor 814. The drain of the transistor 813 is connected to the source of 823. Similarly, the drain of 814 is connected to the source of 826. The gates of 823, 824, 825 and 826 are connected in a manner illustrated in the figure. The drains of 823, 824, 825 and 826 are appropriately grounded. The operation of the circuit of FIG. 8A is discussed in further detail below in connection with the corresponding layout diagram in FIG. 8B.

Figure 8B:
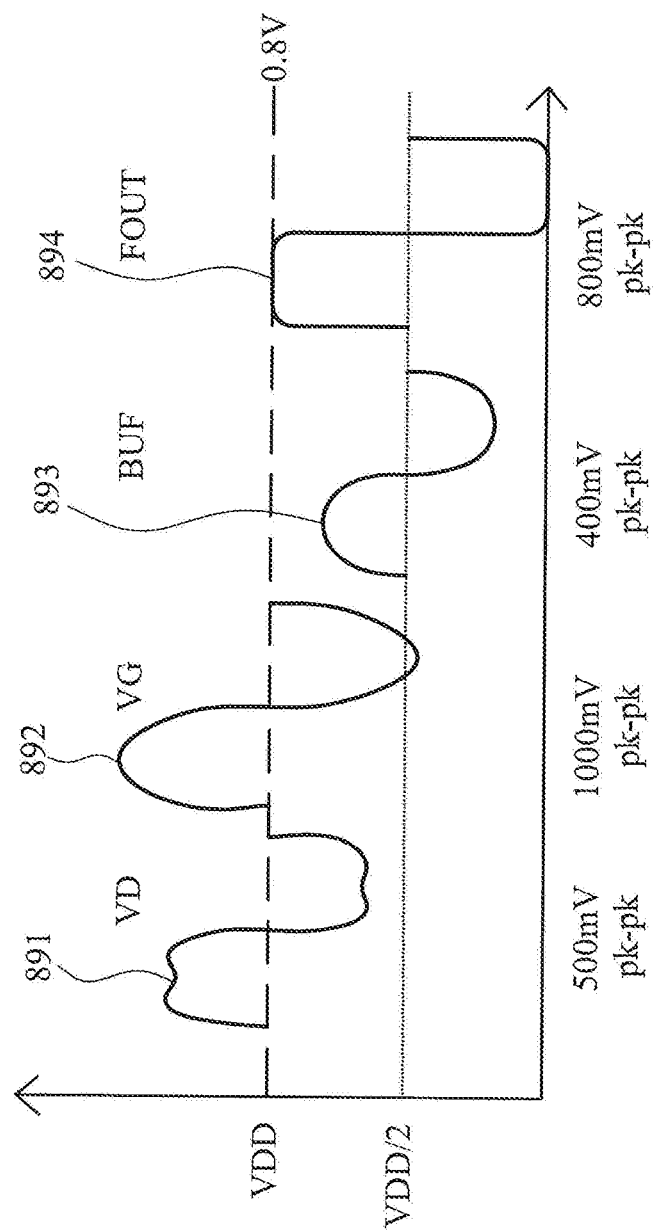
FIG. 8B is a schematic plot illustrating the signal waveforms on VD+/−, VG+/−, BUF+/− and FOUT respectively in FIG. 8A in accordance with some embodiments.

FIG. 8B is a schematic plot illustrating the signal waveforms on VD+/−, VG+/−, BUF+/− and FOUT respectively in accordance with some embodiments. Signal waveform 891 is the waveform on VD+ and VD− with a peak-to-peak value of 500 mV and an average of VDD. Signal waveform 892 is the waveform on VG+ and VG− with a peak-to-peak value of 1000 mV and an average of VDD. Signal waveform 893 is the waveform on BUF+ and BUF− with a peak-to-peak value of 400 mV and an average of VDD/2. Signal waveform 894 is the waveform on FOUT with a peak-to-peak value of 800 mV and an average of VDD/2.

FIG. 9 is a layout diagram illustrating a point-symmetric pseudo-differential layout corresponding to the circuit implementation of an adjustable multi-turn magnetic coupling transformer in FIG. 8A, in accordance with some embodiments. The layout includes a first transformer 910, a second transformer 920, a first switched capacitor bank 904A and a second switched capacitor bank 904B. The first transformer 910 includes a first inductor 902A, a second inductor 903A and a first magnetic coupling ring 901A. The inductors 902A and 903A have similar three dimensional layout as illustrated in FIG. 1A. The second transformer 920 includes a third inductor 902B, a fourth inductor 903B and a second magnetic coupling ring 901B. The inductors 902B and 903B have similar three dimensional layout as illustrated in FIG. 1A The loop formed by the switches 801, 802 and inductors 815, 816 corresponds to the outside magnetic coupling rings 901A and 901B, which correspond to and have similar functionality as the magnetic coupling turn 101 of FIGS. 1B and 1C, and magnetic coupling turns 201A, 201B and 201C of FIGS. 2A, 2B and 2C, for example, discussed above. FIGS. 3A, 3B, 3C, 4A, 4B and 4C show additional embodiments of the magnetic coupling turns that may be implemented by turns 901A and 901B of FIG. 9. The inductors 809, 810 correspond to the inductors 902A and 902B, and the inductors 811, 812 correspond to the inductors 903A and 903B. According to some embodiments, the inductors 902A/902B and 903A/903B couple to form a transformer, which is also discussed in FIG. 1A through FIG. 4C. All discussions above regarding magnetic coupling turns and transformers apply here for 901A/901B, 902A/902B and 903A/903B, and their corresponding schematics in FIG. 8A. The capacitors 803, 805, 806, 808, 817, 819, 820 and 822 correspond to the capacitors in the switched capacitor banks 904A and 904B.

According to some embodiments, variable switches 801 and 802 of FIG. 8A control the magnetic coupling ring 901A and 901B of FIG. 9. Additionally, the switches 804 and 807 are connected in parallel to provide a variable-impedance switch for the inductors 809 and 810. Similarly, the switches 818 and 821 are also connected in parallel to provide a variable-impedance switch for the inductors 811 and 812.

According to some embodiments, the transformers/inductors and magnetic coupling turns 901A, 902A and 903A are point symmetric to the transformers/inductors and magnetic coupling turns 901B, 902B and 903B relative to the geometric center point 990. As used herein, if a figure or graph can be rotated 180° about a center point P and resulting figure or graph is identical to the original, then the figure or graph is said to be "point symmetric" relative to the point of symmetry P. The magnetic coupling turn 901A being point-symmetric to the magnetic coupling turn 901B relative to the point 990 means that when the magnetic coupling turn 901A is rotated 180 degrees with 990 as the rotation center, the magnetic coupling turn 901A overlaps with the magnetic coupling turn 901B. The same applies to the inductors 902A/B, 903A/B and capacitor bank 904A/B. The switched capacitor bank 904A is also arranged in a way that is point-symmetric to the switched capacitor bank 904B. According to some embodiments, the directions of the electric currents inside the magnetic coupling turns 901A, and inductors 902A, 903A are opposite to the directions of the electric currents inside the magnetic coupling turns 901B, and inductors 902B 903B, so that the overall magnetic field inside the magnetic coupling turns and inductors 901A, 902A and 903A has an opposite direction as compared to the overall magnetic field inside the magnetic coupling turns and inductors 901B, 902B and 903B.

According to some embodiments, the ground 905 and the power 906 are separated by a plurality of capacitors. The power 906 and the ground 905 provide power to the magnetic coupling turns 901A/B, transformers/inductors 902A/B, 903A/B, and capacitor bank 904A/B. According to some embodiments, the power 906 is arranged as a square with sides of length 125 μm. The ground is arranged as another square inside the square of power 906 and separated by capacitors 907. The overall scheme is point symmetric. As indicated earlier, all discussions in FIGS. 1A through 7B apply to the schematic FIG. 8A and layout FIG. 8B.

According to some embodiments, an integrated circuit device is disclosed. The integrated circuit device include at least one inductor having at least one turn, a magnetic coupling ring positioned adjacent to the at least one inductor, the magnetic coupling ring comprising at least two magnetic coupling turns, the at least two magnetic coupling turns are disposed adjacent to the at least one turn to enable magnetic coupling between the at least two magnetic coupling turns and the at least one turn The integrated circuit device also includes a power electrode and a ground electrode, wherein the power electrode and the ground electrode are coupled to the at least one inductor and the magnetic coupling ring to provide a first current in the at least one inductor having a direction opposite to a second current in the magnetic coupling ring. According to some embodiments, all of the at least two magnetic coupling turns are outside the at least one turns of the inductor. According to some embodiments, all of the at least two magnetic coupling turns are inside the at least one turns of the inductor. According to some embodiments, at least one of the at least two magnetic coupling turns are outside the at least one turns of the inductor, and at least one of the at least two magnetic coupling turns are inside the at least one turns of the inductor. According to some embodiments, all of the at least two magnetic coupling turns are above the at least one turns of the inductor. According to some embodiments, all of the at least two magnetic coupling turns are below the at least one turns of the inductor. According to some embodiments, at least one of the at least two magnetic coupling turns are above the at least one turns of the inductor, and at least one of the at least two magnetic coupling turns are below the at least one turns of the inductor.

According to some embodiments, another integrated circuit device is disclosed. The device includes at least one inductor having at least one turn, a magnetic coupling ring positioned adjacent to the at least one inductor, the magnetic coupling ring comprising at least one magnetic coupling turn, wherein the at least one magnetic coupling turn is disposed adjacent to the at least one turn to enable magnetic coupling between the at least one magnetic coupling turn and the at least one turn. The integrated circuit device also includes a plurality of switches coupling the at least one magnetic coupling turn for switching on and off the at least one magnetic coupling turns, and a power electrode and a ground electrode, the power electrode and the ground electrode are coupled to the at least one inductor and the magnetic coupling turn to provide a first current in the at least one inductor having a direction opposite to a second current in the magnetic coupling turn. According to some embodiments, the plurality of switches are MOS transistors. According to some embodiments, the plurality of switches are PMOS transistors. According to some embodiments, the plurality of switches are NMOS transistors. According to some embodiments, the plurality of switches are bipolar junction transistors. According to some embodiments, the plurality of switches are a combination of PMOS, NMOS and bipolar junction transistors. According to some embodiments, the size ratio of the N-th MOS of the plurality of MOS transistors to the first MOS transistor is $2^{(N-1)}$. According to some embodiments, the size ratio of the N-th MOS of the plurality of MOS transistors to the first MOS transistor is $10^{(N-1)}$.

According to some embodiments, another integrated circuit device is disclosed. The integrated circuit device includes a first transformer comprising a first inductor, a second inductor and a first magnetic coupling ring and a second transformer comprising a third inductor, a fourth inductor and a second magnetic coupling ring. The first inductor is point-symmetric with respect to the third inductor relative to a center point of the integrated circuit device. The second inductor is point-symmetric to the fourth inductor with respect to the center point. The first magnetic coupling ring is point-symmetric with respect to the second magnetic coupling turn relative to the center point. The integrated circuit device also includes a power electrode and a ground electrode, the power electrode and the ground electrode are coupled to the first and the second inductor and the first magnetic coupling turn to provide a first current in the first and the second inductor having a direction opposite to a second current in the first magnetic coupling turn, the power electrode and the ground electrode are coupled to the third and the fourth inductors and the second magnetic coupling ring to provide a third current in the third and fourth inductors having a direction opposite to a fourth current in the second magnetic coupling ring.

According to some embodiments, the first inductor and the third inductor of the integrated circuit device are separated by a first plurality of capacitors, and the first plurality of capacitors are arranged in two groups which are point-symmetric to each other. According to some embodiments, the second inductor and the fourth inductor of the integrated circuit device are separated by a second plurality of capacitors, and the second plurality of capacitors are arranged in two groups which are point-symmetric to each other. According to some embodiments, the first magnetic coupling turn and the second magnetic coupling turn of the integrated circuit device are separated by a third plurality of capacitors, and the third plurality of capacitors are arranged in two groups which are point-symmetric to each other. According to some embodiments, the power electrode and the ground electrode of the integrated circuit device are separated by a fourth plurality of capacitors, the power electrode is arranged as a square with sides of 125 μm, the power electrode is coupled to the first and the third inductors, and the ground is coupled to the second and the fourth inductors.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a transformer comprising a first inductor and a second inductor, wherein the first and second inductors each comprises at least one turn; and
a magnetic coupling ring comprising at least two magnetic coupling turns,
wherein the at least two magnetic coupling turns are each disposed to be either surrounding or surrounded by the transformer in a top view to enable magnetic coupling between the magnetic coupling ring and the transformer, wherein the at least two magnetic coupling turns are in at least two different levels with respect to one another, and
wherein the transformer is configured to conduct a first current in a first direction and the magnetic coupling ring is configured to conduct a second current in a second direction opposite the first direction.

2. The integrated circuit device of claim 1, wherein all of the at least two magnetic coupling turns are disposed surrounding the transformer.

3. The integrated circuit device of claim 1, wherein all of the at least two magnetic coupling turns are disposed surrounded by the transformer.

4. The integrated circuit device of claim 1, wherein at least one of the at least two magnetic coupling turns is disposed surrounding the transformer, and at least one of the at least two magnetic coupling turns is disposed surrounded by the transformer.

5. The integrated circuit device of claim 1, wherein all of the at least two magnetic coupling turns are above the level of the transformer.

6. The integrated circuit device of claim 1, wherein all of the at least two magnetic coupling turns are below the level of the transformer.

7. The integrated circuit device of claim 1; wherein at least one of the at least two magnetic coupling turns is above the level the transformer, and at least one of the at least two magnetic coupling turns is below the level of the transformer.

8. An integrated circuit device, comprising:
a transformer comprising a first inductor and a second inductor, wherein the first and second inductors each comprises at least one turn;
a magnetic coupling ring comprising a plurality of magnetic coupling turns, wherein the plurality of magnetic coupling turns are each disposed adjacent to the transformer in a top view to enable magnetic coupling between the magnetic coupling ring and the transformer, wherein the plurality of magnetic coupling turns are in at least two different levels with respect to one another, and wherein the transformer is configured to conduct a first current in a first direction and the magnetic coupling ring is configured to conduct a second current in a second direction opposite the first direction; and
a plurality of switches coupled to the plurality of magnetic coupling turns for switching on and off the plurality of magnetic coupling turns.

9. The integrated circuit device of claim 8, wherein the plurality of switches are metal-oxide-semiconductor (MOS) transistors.

10. The integrated circuit device of claim 8, wherein the plurality of switches are p-type MOS (PMOS) transistors.

11. The integrated circuit device of claim 8, wherein the plurality of switches are n-type MOS (NMOS) transistors.

12. The integrated circuit device of claim 8, wherein the plurality of switches are bipolar junction transistors.

13. The integrated circuit device of claim 8, wherein the plurality of switches are a combination of PMOS, NMOS and bipolar junction transistors.

14. The integrated circuit device of claim 9, wherein the size ratio of the N-th MOS of the plurality of MOS transistors to the first MOS transistor is $2^{(N-1)}$.

15. The integrated circuit device of claim 9, wherein the size ratio of the N-th MOS of the plurality of MOS transistors to the first MOS transistor is $10^{(N-1)}$.

16. An integrated circuit device, comprising:
a first transformer comprising a first inductor, a second inductor and a first magnetic coupling ring, wherein the first transformer is configured to conduct a first current in a first direction and the first magnetic coupling ring is configured to conduct a second current in a second direction opposite the first direction; and
a second transformer comprising a third inductor, a fourth inductor and a second magnetic coupling ring, wherein the second transformer is configured to conduct a third current in a third direction and the second magnetic coupling ring is configured to conduct a fourth current in a fourth direction opposite the third direction, and
wherein the first inductor is point-symmetric with respect to the third inductor relative to a center point of the integrated circuit device, the second inductor is point-symmetric with respect to the fourth inductor relative to the center point, and the first magnetic coupling ring is point-symmetric with respect to the second magnetic coupling ring relative to the center point.

17. The integrated circuit device of claim 16, wherein the first inductor and the second inductor are separated by a first plurality of capacitors, and the first plurality of capacitors are arranged in two groups which are point-symmetric to each other.

18. The integrated circuit device of claim 16, wherein the third inductor and the fourth inductor are separated by a second plurality of capacitors, and the second plurality of capacitors are arranged in two groups which are point-symmetric to each other.

19. The integrated circuit device of claim 16, wherein the first magnetic coupling ring and the second magnetic coupling ring are separated by a third plurality of capacitors, and the third plurality of capacitors are arranged in two groups which are point-symmetric to each other.

20. The integrated circuit device of claim 16, wherein each of the first magnetic coupling ring and the second magnetic coupling ring comprises at least two magnetic coupling turns, wherein each of the at least two magnetic coupling turns is disposed to be either surrounding or surrounded by the first transformer and the second transformer, respectively, in a top view.

* * * * *